United States Patent
Cha

(10) Patent No.: US 6,885,240 B2
(45) Date of Patent: Apr. 26, 2005

(54) AMPLIFYING CIRCUIT WITH VARIABLE LOAD DRIVABILITY

(75) Inventor: You-Jin Cha, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/614,757

(22) Filed: Jul. 8, 2003

(65) Prior Publication Data

US 2004/0051587 A1 Mar. 18, 2004

(30) Foreign Application Priority Data

Jul. 19, 2002 (KR) .............................. 10-2002-0042304

(51) Int. Cl.[7] .............................. H03F 3/45; H03F 3/26
(52) U.S. Cl. ..................... 330/51; 330/255; 330/264
(58) Field of Search ..................... 330/51, 253, 255, 330/264, 267

(56) References Cited

U.S. PATENT DOCUMENTS 5,606,287 A * 2/1997 Kobayashi et al. ......... 330/255

FOREIGN PATENT DOCUMENTS

| JP | 2000-252771 | 9/2000 | ............. H03F/3/45 |
| JP | 2001-308690 | 11/2001 | ........... H03K/17/08 |

* cited by examiner

Primary Examiner—Steven J. Mottola
(74) Attorney, Agent, or Firm—Mayer, Brown, Rowe & Maw LLP

(57) ABSTRACT

The present invention relates to an amplifying circuit that can change load drivability responding to load conditions, and reduce power consumption. The amplifying circuit according to the present invention comprises an amplifying means that amplifies input signals a first time to generate a first and a second amplified signals through a first and a second transistors, and further amplifies the first and second amplified signals once again through a third and a fourth transistors, for final outputs; a detecting means for detecting the first and second amplified signals from the amplifying means and generating a first and a second detection signals; and a load drivability control means that is controlled by the first and second detection signals from the detecting means to change load drivability of the amplifying means.

15 Claims, 8 Drawing Sheets

US 6,885,240 B2

AMPLIFYING CIRCUIT WITH VARIABLE LOAD DRIVABILITY

FIELD OF THE INVENTION

The present invention relates to an amplifying circuit, and, more particularly, to a 2-stage amplifying circuit that has variable load drivability responding to load conditions and smaller power consumption.

DESCRIPTION OF THE PRIOR ART

In a conventional 2-stage as shown on FIG. 1, input voltage is applied to non-inverted input (IN), and the output (OUT) of the amplifying circuit is input to inverted input (INC) as negative feedback. Therefore, the circuit operates as a buffer, delivering input voltage (IN) as output signal (OUT) without change. Although not shown on FIG. 1, the load (capacitive or resistive) driven by the amplifying circuit is connected to the output (OUT).

FIG. 2 shows the result of simulation for input signal (IN) and output signal (OUT) when a capacitance load of 100 pF is connected between the output (OUT) and the ground (VSS) of the 2-stage amplifying circuit, with source voltage (VDD) of 5V. FIG. 3A and FIG. 3B are magnified views of region A and region B of FIG. 2. When a square wave of varying levels from 0.1 to 4.9 is applied as input signal (IN), it can be seen that there is a delay of about 10 μsec for the output signal (IN) to reach the level of the input signal (IN). This delay time is called "settling time" for amplifying circuit, and is one of the important performance characteristics of an amplifying circuit, determined by the load capacitance, consumption current and phase of the amplifying circuit.

In general amplifying circuits, the load capacitance connected to the output is fixed, and the amplifying circuit is designed to have a settling time that is optimal for the fixed load condition.

For example, when a capacitive load of 10 nF is connected to the output (OUT) of the amplifying circuit in FIG. 1, the amplifying circuit will have a settling time of more than 30 μsec, as shown on FIG. 4, FIG. 5A and FIG. 5B. Therefore, in order to reduce the settling time to 10 μsec for a amplifying circuit with 10 nF of capacitive load, it is necessary to increase the size of the output transistors (P5, N5) shown on FIG. 1.

If the size of the output transistors (P5, N5) is more than quadrupled for the purpose of reducing the settling time of the amplifying circuit, settling time is reduced to 20 μsec as shown on FIG. 6, FIG. 7A and FIG. 7B, but the consumption current is increased by more than three times.

As described above, in a system where load capacitance is varying between 100 pF and 10 nF, increasing the size of the output transistor of the amplifying circuit can reduce the settling time to a satisfactory level. However, this solution is difficult to use for a low power system, like mobile electronics, because the power consumption of amplifying circuit is increased.

SUMMARY OF THE INVENTION

In order to solve the above-described problems, it is, therefore, an object of the present invention to provide an amplifying circuit, which enables variable load drivability responding to load conditions, and drives variable load without increasing power consumption.

In accordance with an aspect of the present invention, there is provided an amplifying circuit that can change load drivability responding to load conditions, and reduce power consumption. The amplifying circuit according to the present invention comprises an amplifying means that amplifies input signals a first time to generate a first and a second amplified signals through a first and a second transistors, and further amplifies the first and second amplified signals once again through a third and a fourth transistors, for final outputs; a detecting means for detecting the first and second amplified signals from the amplifying means and generating a first and a second detection signals; and a load drivability control means that is controlled by the first and second detection signals from the detecting means to change load drivability of the amplifying means.

The amplifying circuit according to the present invention has the advantage of reducing settling time by detecting changes when there are changes in the input signal and increasing load drivability, and reducing power consumption by detecting no changes in the input signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, preferred embodiments of the present invention are described in detail with reference to the drawings, so that those skilled in the art can easily understand the technical idea of the present invention.

Figure 8:
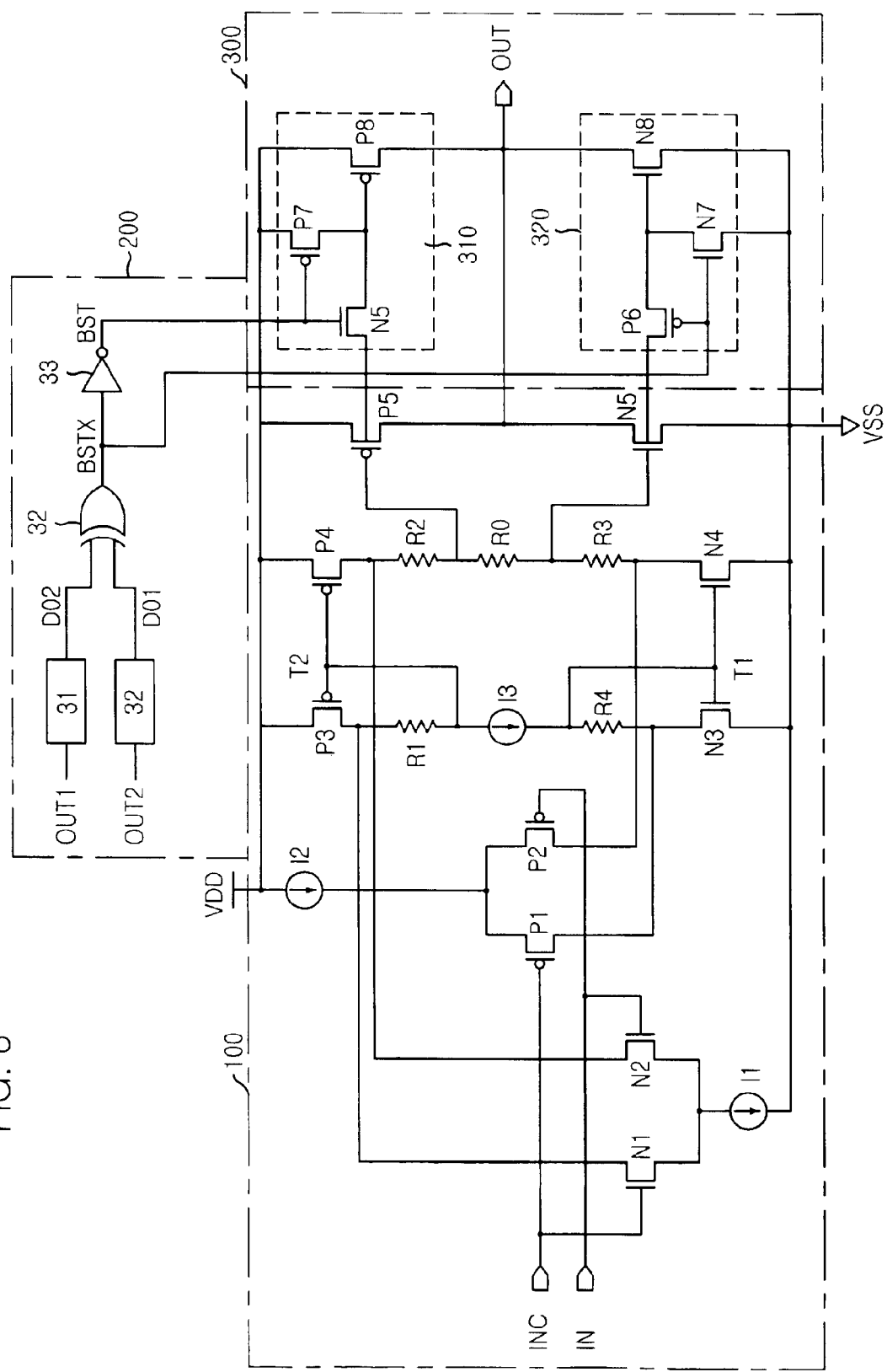
FIG. 8 is a schematic of a 2-stage amplifying circuit with variable load drivability according to the present invention.

FIG. 8 is a schematic of a 2-stage amplifying circuit according to an embodiment of the present invention.

In FIG. 8, the 2-stage amplifying circuit according to this embodiment is provided with an amplifying means (100) for outputting received input signals (IN) to the output stage (OUT) without change, a detecting means (200) for generating detection signals as it detects voltage levels in the input signals (OUT1, OUT2) to the output transistors of PMOS type (P5) and NMOS type (N5) of the amplifying means (100), and a load drivability control means (300) for changing the load drivability of the amplifying means (100) in response to the detection signals from the detection means (200).

Figure 1:
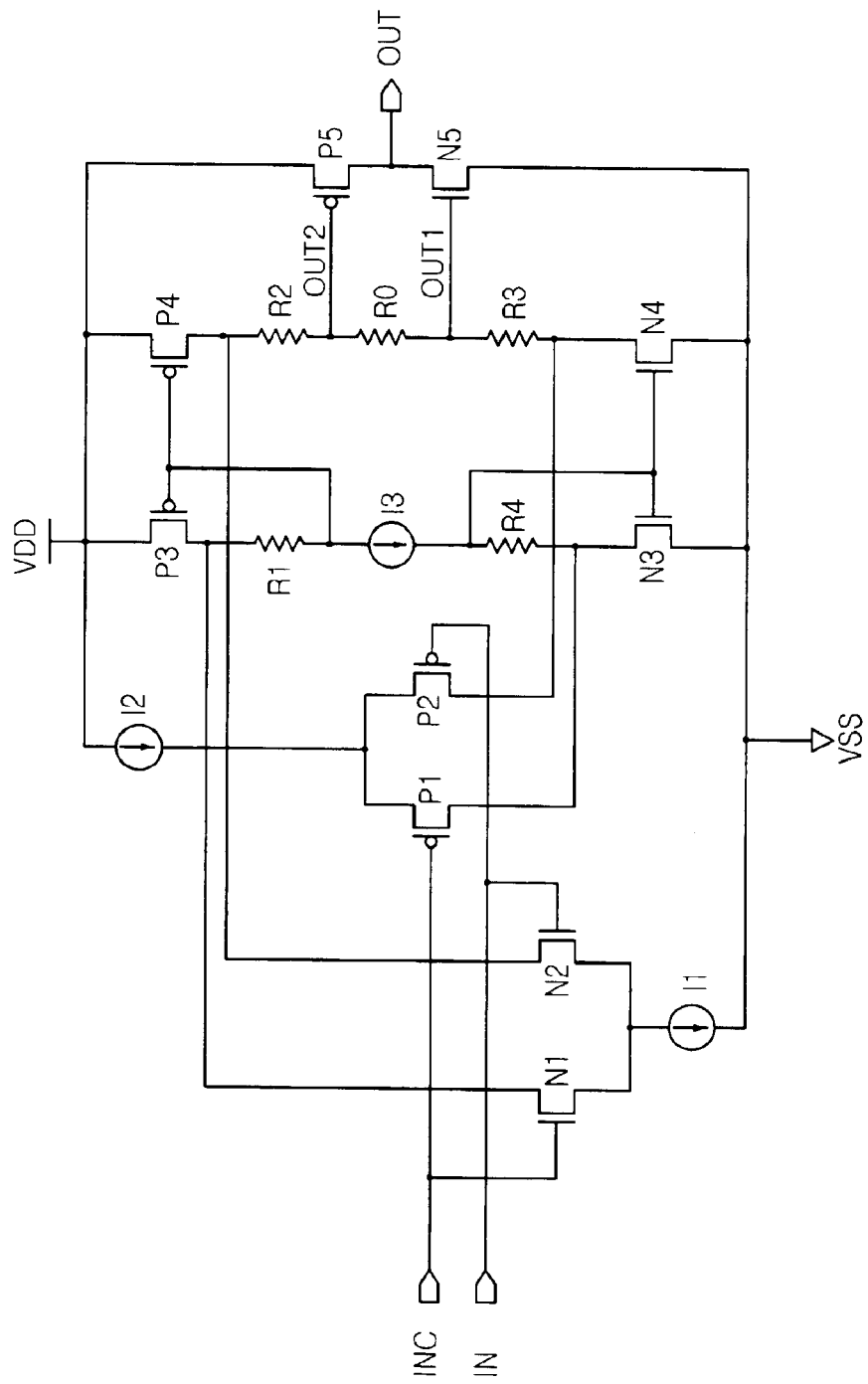
FIG. 1 is a schematic of conventional 2-stage amplifying circuit.
Figure 2:
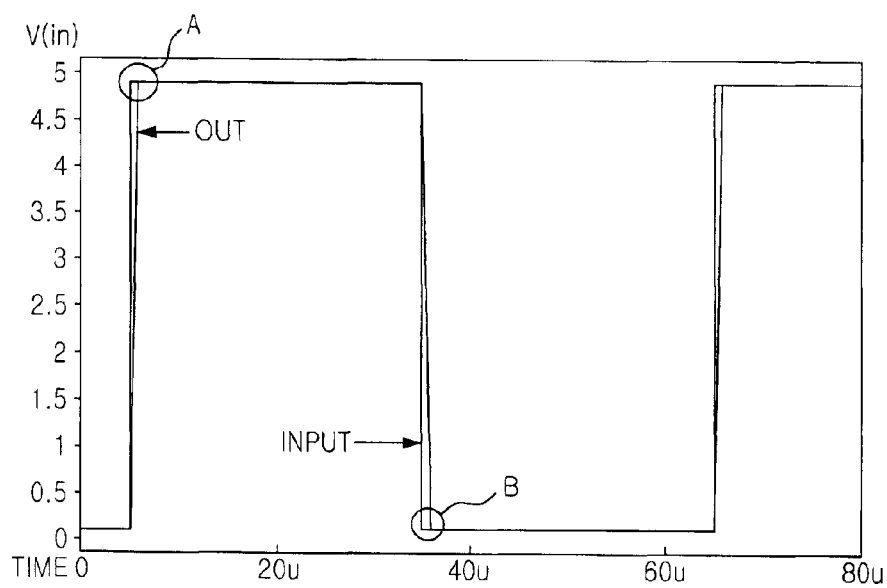
FIG. 2 is a waveform diagram of conventional 2-stage amplifying circuit.
Figure 3A:
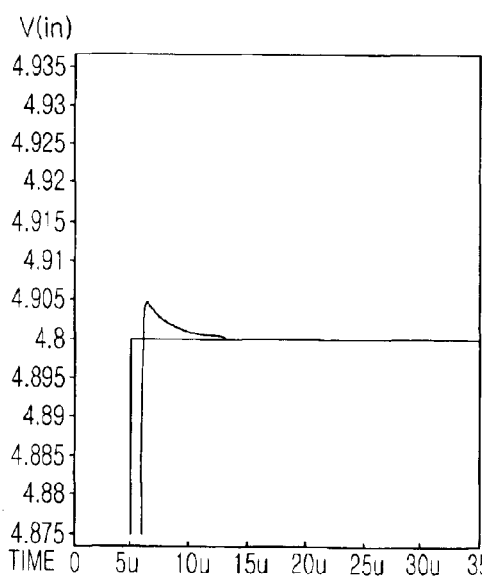
FIG. 3A and FIG. 3B are magnified views of region A and region C of FIG. 2.
Figure 3B:
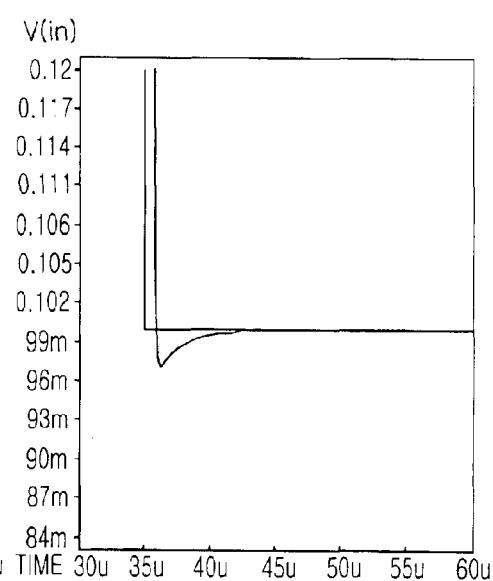
Figure 4:
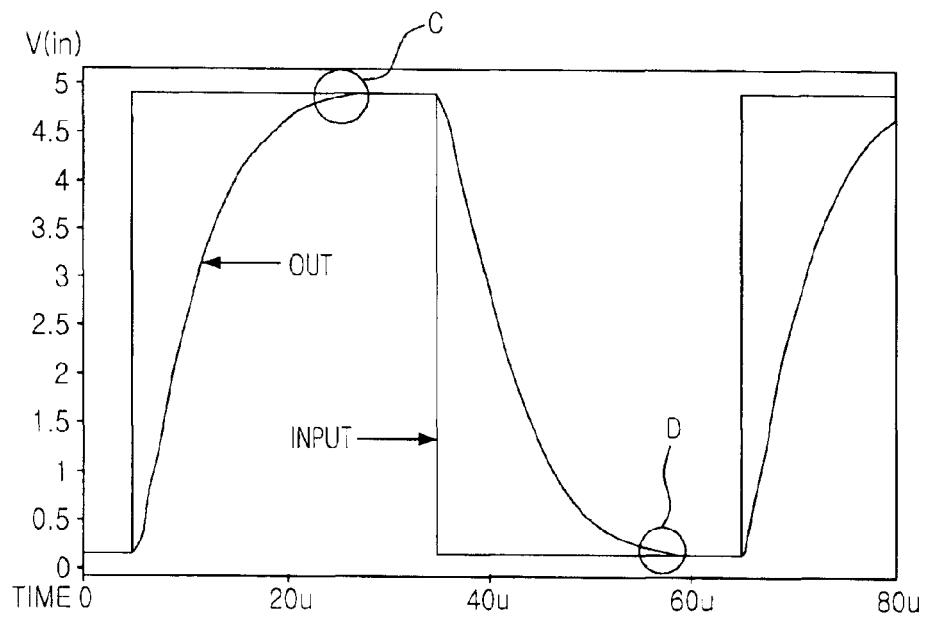
FIG. 4 is a waveform diagram of the 2-stage amplifying circuit when load capacitor has a capacitance of 10 nF.
Figure 5A:
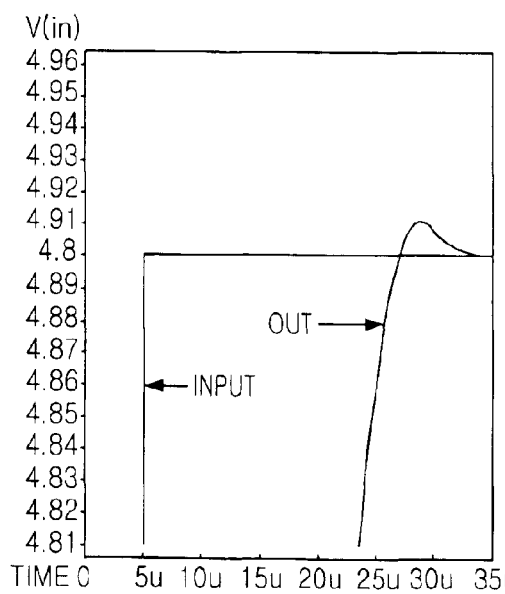
FIG. 5A and FIG. 5B are magnified views of region C and region D of FIG. 4.
Figure 5B:
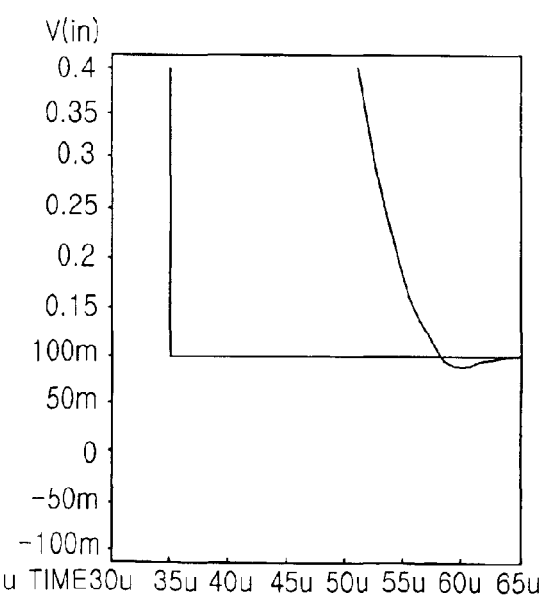
Figure 6:
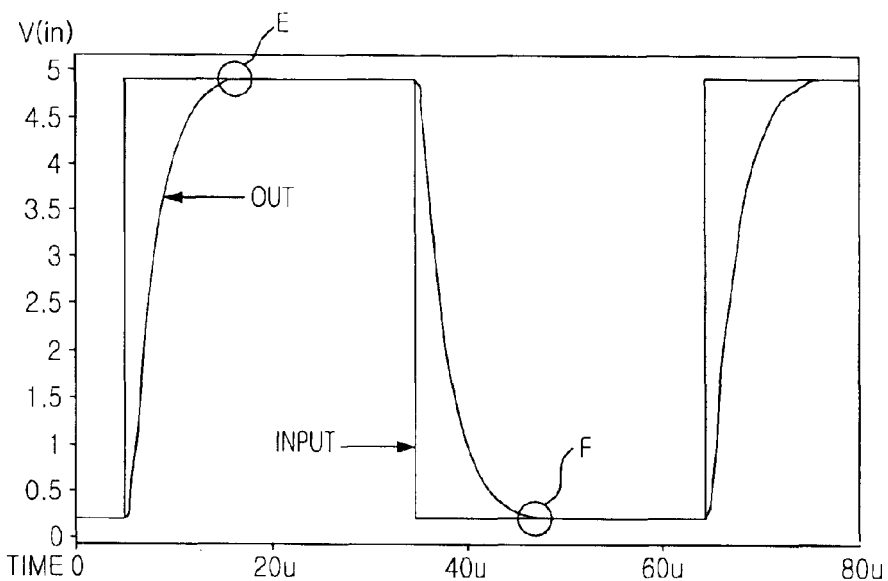
FIG. 6 is a waveform diagram of the 2-stage amplifying circuit when the size of the output transistor is changed to four times the original size.
Figure 7A:
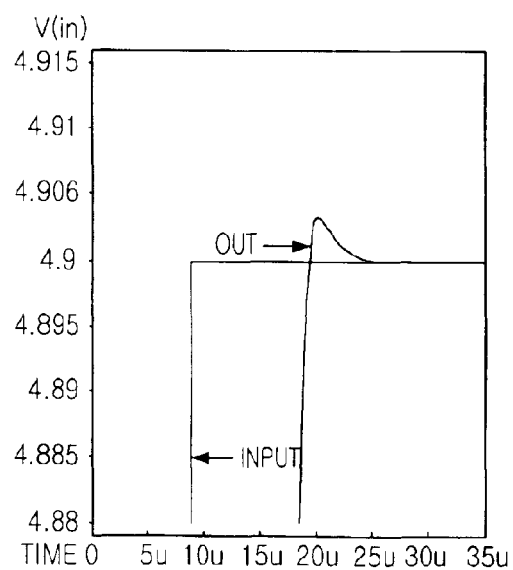
FIG. 7A and FIG. 7B are magnified views of region E and region F of FIG. 6.
Figure 7B:
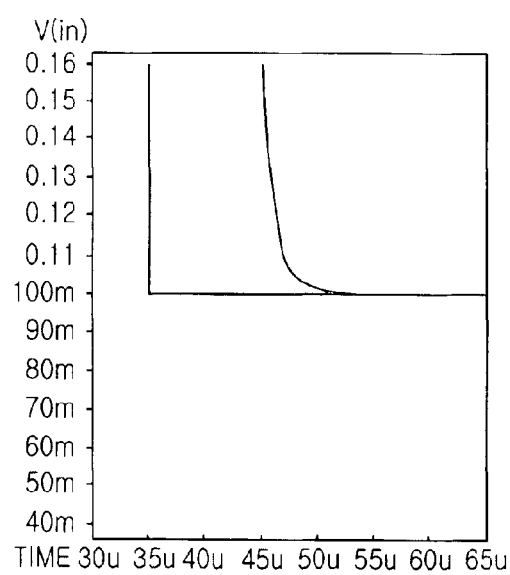

The amplifying means (100) is a 2-stage amplifying circuit that first amplifies input signals (IN), outputs them as stage-1 amplified signals (OUT1, OUT2) through the PMOS transistor (P4) and the NMOS transistor (N4), and amplifies them once again through another PMOS transistor (P5) and another NMOS transistor (N5), and outputs them through the output stage (OUT). Its configuration and operation is the same as that of the 2-stage amplifying circuit shown on FIG. 1.

The detecting means (200) comprises two Schmitt-trigger means (31, 32) that detect voltage level changes in the input signals (OUT1, OUT2) to the output transistors of the amplifying means (100) (NMOS transistor (N5) and the PMOS transistor (P5)), and an exclusive OR gate (33) and an inverter (34) that receive the outputs from the Schmitt-trigger means (31, 32) and output detection signals (BSTX, BST) to control the load drivability control means (300).

The first and second Schmitt-trigger means (31, 32) output a low level signal (ground level) when the input signals (OUT1, OUT2) become the same level as that of the gate signal (T2), i.e. the input signal to the PMOS transistor (P4) that outputs amplified signal (OUT2). The first and second Schmitt-trigger means (31, 32) output a high level signal (source voltage level) when the input signals (OUT1, OUT2) become the same level as that of the gate signal (T1), i.e. the input signal to the NMOS transistor (N4) that outputs amplified signal (OUT1).

The load drivability control means (300) comprises a first control means (310) that is driven by the detection signal (BST) of the detection means (200) and increases the drivability of the output transistor (P5) of the amplifying circuit, and a second control means (320) that is driven by the detection signal (BSTX) of the detection means (200) and increases the drivability of the output transistor (N5) of the amplifying means (100).

The first control means (310) comprises an NMOS transistor (N6) and a PMOS transistor (P7) that function as switches, and a PMOS transistor (P8) that increases the load drivability in cooperation with the output transistor (P5) of the amplifying means (100) using the first amplified signal (OUT1) as the gate input.

The second control means (320) comprises an NMOS transistor (N7) and a PMOS transistor (P6) that function as switches, and an NMOS transistor (N8) that changes the load drivability in cooperation with the output transistor (N5) of the amplifying means (100) using the second amplified signal (OUT2) as the gate input.

The output transistors of the load drivability control means (300), i.e. PMOS transistor (P8) and the NMOS transistor (N8), have a size not less than four times that of output transistors of the amplifying means (100), i.e. the PMOS transistor (P5) and the NMOS transistor (N5).

The operation of the amplifying circuit with variable load drivability is described in the following, with reference to the input/output waveform diagram in FIG. 9, FIG. 10A and FIG. 10B, and the operational waveform diagram in FIG. 11.

First, when the input signal level (IN) to the amplifying circuit does not change, as in the settled region A, the amplified signal (OUT2) outputted from the PMOS transistor (P4) stays at the level of the gate signal (T2) of the PMOS transistor (P4), and the amplified signal (OUT1) outputted from the NMOS transistor (N4) stays at the voltage level of the gate signal (T1). Therefore, the two Schmitt-trigger means (31, 32) respectively output high level signals of source voltage (VDD) level and low level signals of ground level.

Therefore, the detecting means (200) generates a high level detection signal (BSTX) and a low level detection signal (BST) respectively, through an exclusive OR gate (33) and an inverter (34), and provides them to the load drivability control means (300).

At the load drivability control means (300), the first control means (310) disables the PMOS transistor (P8) by turning on the PMOS transistor (P7) in response to the low level detection signal (BST), and the second control means (320) disables the NMOS transistor (N8) by turning on the NMOS transistor (N7) in response to the high level detection signal (BSTX).

Also, because the amplified signals (OUT1, OUT2) are no longer delivered to the gate inputs of the PMOS transistor (P8) and the NMOS transistor (N8) when the NMOS transistor (N6) and the PMOS transistor (P6) are turned off, the amplified signal from the PMOS transistor (P5) and the NMOS transistor (N5) of the amplifying means (100) are output through the output stage (OUT).

Figure 11:
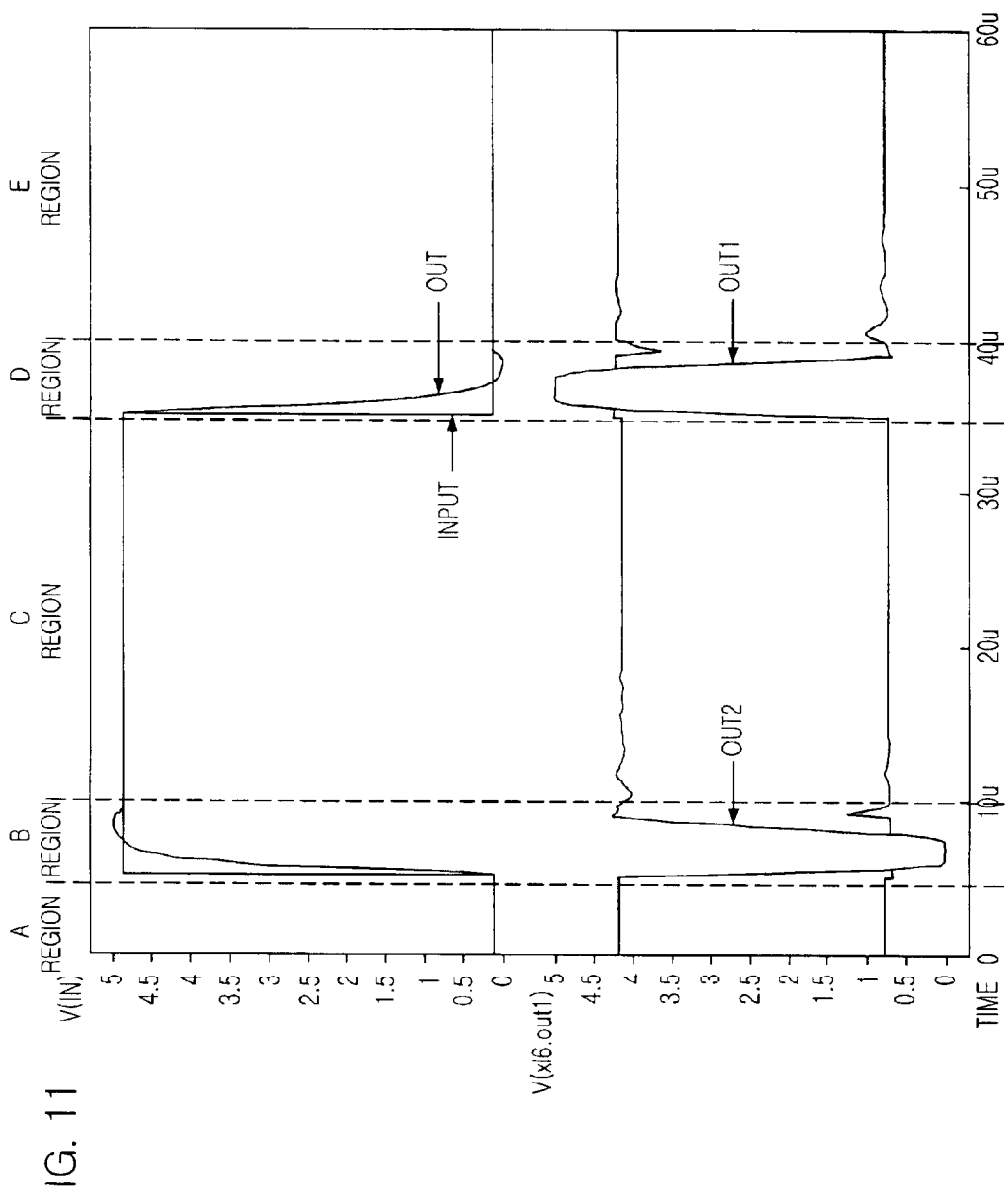
FIG. 11 is a waveform diagram of the 2-stage amplifying circuit of FIG. 8, according to the present invention.

Next, when the input level of the amplifying circuit (IN) is greatly increased and fast operation of the output stage of the amplifying circuit is required, if the voltage at the output (OUT) is smaller than the voltage at-the input (IN), as in region B of FIG. 11, the amplified signals (OUT1, OUT2) are lowered to the ground level (VSS).

Therefore, the Schmitt-trigger means (31) maintains the high level signal of source voltage (VDD) and the Schmitt-trigger means (32) generates the high level signal of source voltage (VDD). And the exclusive OR gate (33) and the inverter (34) respectively generates a low level detection signal (BSTX) and a high level detection signal (BST).

At the first control means (310) of the load drivability control means (300), the PMOS transistor (P6) is turned on by the low level detection signal (BSTX), and the amplified signal (OUT1) is delivered to the gate input of the NMOS transistor (N8). At the second control means (320) of the load drivability control means (300), the NMOS transistor (N6) is turned on by the high level detection signal (BST), and the amplified signal (OUT2) is delivered to the gate input of the PMOS transistor (P8).

Figure 9:
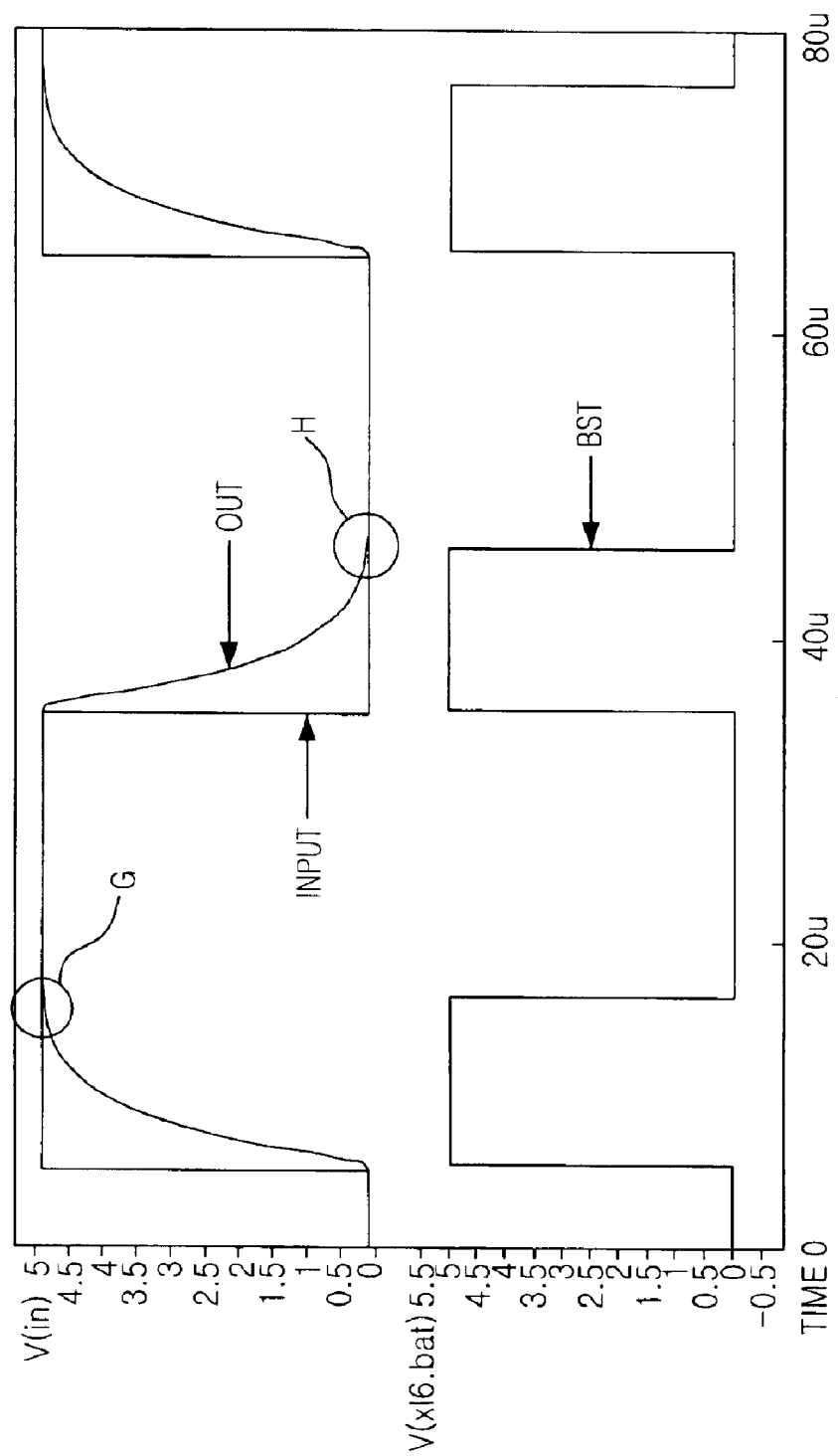
FIG. 9 is a waveform diagram of the 2-stage amplifying circuit according to the present invention.
Figure 10A:
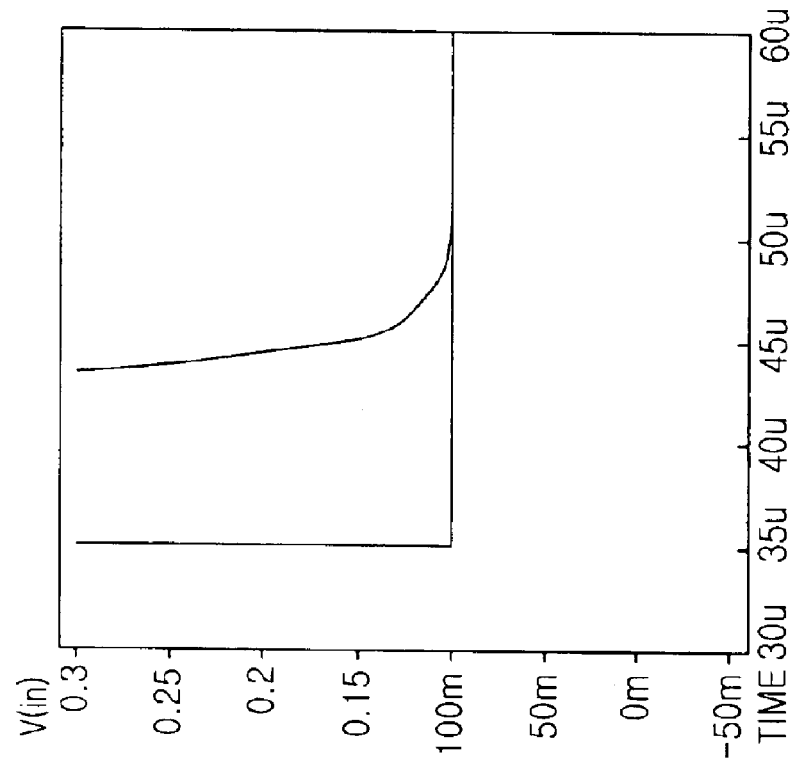
FIG. 10A and FIG. 10B are magnified view of region G and region H of FIG. 9.
Figure 10B:
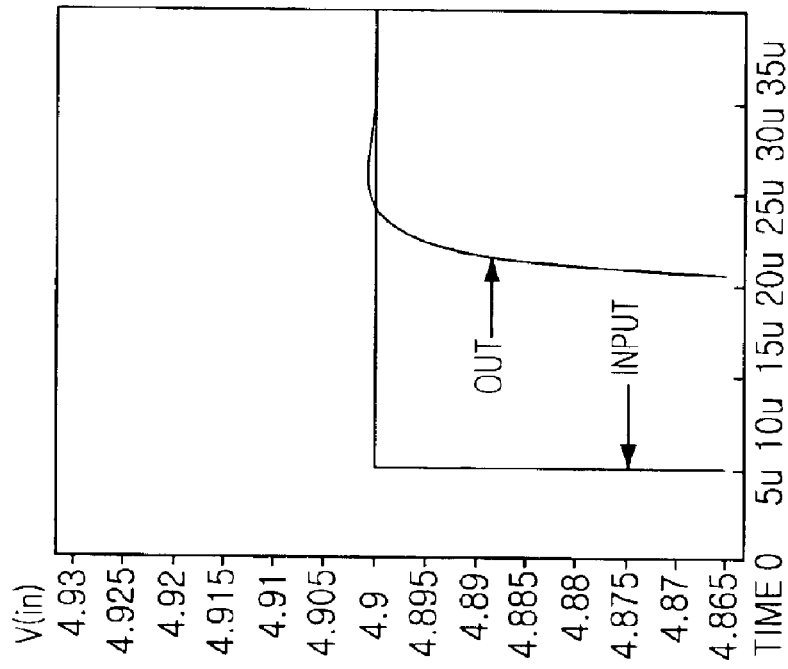

Therefore, the size of the output stage transistors of the amplifying circuit becomes the sum of the sizes of all the PMOS transistors (P5, P8) and the NMOS transistors (N5, N8), which greatly increases the load drivability of the amplifying circuit, and greatly reduces the settling time compared with the conventional amplifying circuit, as shown on FIG. 9, FIG. 10A and FIG. 1b. The PMOS transistor (P7) and the NMOS transistor (N7) of the load drivability control means (300) are turned off by the detection signals (BST, BSTX).

When the load capacitor is charged, and the output (OUT) of the amplifying circuit approaches the level of the input signal (IN), and the output signal (OUT) settles at the input signal level (IN), the amplified signal (OUT2) returns to the voltage level of the node (T2) from the ground level (VSS).

Therefore, when the level of the input signal (IN) does not change (region A) as described above, the output signal of the Schmitt-trigger (32) changes to a low level signal of ground level (VSS). This turns off the PMOS transistor (P8) and the NMOS transistor (N8) of the load drivability control means (300) and reduces power consumption greatly.

Next, when the input signal level (IN) is lowered, like the region D in FIG. 11 where the output signal level (OUT) is greater than the input signal level (IN), the amplified signal (OUT1) approaches the source voltage level (VDD), and the Schmitt-trigger means (31, 32) output high level signals of source voltage (VDD).

Accordingly, the exclusive OR gate (33) and the inverter (34) respectively output a low level detection signal (BSTX) and a high level detection signal (BST), and the PMOS transistor (P6) and the NMOS transistor (N6) of the load drivability control means (300) are turned on.

Therefore, the size of the output stage transistor of the amplifying circuit becomes the sum of the sizes of all the PMOS transistors (P5, P8) and all the NMOS transistors (N5, N8), which greatly increases the load drivability of the amplifying circuit, and greatly reduces the settling time compared with the conventional amplifying circuit, as shown on FIG. 9, FIG. 10A and FIG. 1b.

When the load capacitor is discharged fast, the output signal level (OUT) of the amplifying circuit approaches the input signal-level (IN), and the output signal (OUT) settles at the level of input signal (IN) as in region E in FIG. 11, the amplified signal (OUT1) returns to the level of node (T1) from the source voltage level (VDD).

Therefore, when the level of the input signal (IN) does not change (as in region E), the output signal of the Schmitt-trigger (31) changes to a high level signal of ground level (VDD). This turns off the PMOS transistor (P8) and the NMOS transistor (N8) of the load drivability control means (300) and reduces the power consumption greatly.

In this embodiment of the present invention, the maximum current through the transistors (P5, N5, P8, N8) is decided by the W/L size of these transistors, which means that the settling time is decided by these transistors. Therefore, when the signal level of the amplified signal (OUT2) drops to the ground level (VSS), it is detected by the detecting means (200), which increases the drivability through the load drivability control means. When the amplifying circuit is almost settled and the amplified signal level (OUT2) returns to the signal level of the node (T2), this is detected by the detecting means (200) and causes the load drivability control means (300) to be disabled.

When the amplified signal level (OUT1) rises to the source voltage level (VDD), it is detected by the detecting means (200), which increases the drivability through the load drivability control means (300). When the amplifier circuit is almost settled and the amplified signal level (OUT1) returns to the source voltage level, this is detected by the detecting means (200) and disables the load drivability control means (300). Therefore, when the input signal (IN) changes, the load drivability is increased to reduce the settling time, and when the input signal (IN) does not change, the power consumption is minimized.

As described above, according to the present invention, when there are changes in input signal level (IN), it is detected, and causes the load drivability control means to increase the load drivability and to reduce the settling time, and when there is no change in the input signal level, it is also detected and causes the load drivability control means to be disabled, resulting in smaller power consumption.

Although the technical idea of the present invention has been described in detail in connection with preferred embodiments, it should be obvious that various modifications, additions and alterations may be made to the invention by those skilled in the art without departing from the spirit and scope of the invention as defined in the appended claims.

What is claimed is:

1. An Amplifying circuit with variable load drivability, comprising:
    an amplifying means for amplifying input signals a first time through a first and a second transistors to generate first and second amplified signals and amplifying the first and second amplified signals a second time through a third and a fourth transistors to generate output signals;
    a detecting means for detecting the first and second amplified signals from said amplifying means to generate a first and a second detection signals; and
    a load drivability control means controlled by the first and second detection signals outputted from the detecting means for changing load drivability of the amplifying means,
    wherein the detecting means further includes:
        a Schmitt-trigger means for detecting voltage level change in the first and second amplified signals;
        an exclusive OR gate for receiving output signals from said Schmitt-trigger means to generate the first detection signal; and
        an inverter for inverting the first detection signal to generate the second detection signal.

2. The amplifying circuit with variable load drivability as recited in claim 1, wherein said first arid second Schmitt-trigger means output a low level signal at ground level if said first and second amplified signals reach input signal level of said first transistor, and outputs a high level signal of source voltage if said first and second amplified signals reach input signal level of said second transistor.

3. The amplifying circuit with variable load drivability as recited in claim 1, wherein said load drivability control includes:
    a first control means that is driven by said second detection signal of said detecting means and increases drivability of said third transistor of said amplifying means; and
    a second control means that is driven by said first detection signal of said detecting means and increases drivability of said fourth transistor of said amplifying means.

4. The amplifying circuit with variable load drivability as recited in claim 3, wherein the first control means includes:
    a fifth transistor that increases load drivability in cooperation with said third transistor of said amplifying means;
    a sixth transistor that disables said fifth transistor in response to said second detection signal; and
    a seventh transistor that delivers said first amplified signals to gate input of said fifth transistor in response to said second detection signal.

5. The amplifying circuit with variable load drivability as recited in claim 4, wherein said fifth transistor of said first control means and said third transistor of said amplifying means comprise PMOS transistors, and said fifth transistor has a size not less than four (4) times that of said third transistor.

6. The amplifying circuit with variable load drivability as recited in claim 4, wherein said sixth transistor and seventh transistors of said first control means comprise respectively a PMOS transistor and a NMOS transistor, both receiving said second detection signal as gate inputs.

7. The amplifying circuit with variable load drivability as recited in claim 3, wherein said second control means includes:

an eighth transistor that increases load drivability in cooperation with said fourth transistor of said amplifying means;

a ninth transistor that disables said eighth transistor in response to said second detection signals; and a tenth transistor that delivers said second amplified signal to a gate input of said eighth transistor in response to said second detection signal.

8. The amplifying circuit with variable load drivability as recited in claim 7, wherein said eighth transistor of said second control means and said fourth transistor of said amplifying means comprise NMOS transistors, and said eighth transistor has a size not less than four times that of said fourth transistor.

9. The amplifying circuit with variable load drivability as recited in claim 7, wherein said ninth and tenth transistors of said second control means respectively comprise a PMOS transistor and an NMOS transistor, both receiving said second detection signal as gate inputs.

10. An Amplifying circuit with variable load drivability, comprising:

an amplifying means for amplifying input signals a first time through a first and a second transistors to generate first and second amplified signals and the first and second amplified signals a second time through a third and a fourth transistors to generate output signals;

a detecting means for detecting the first and second amplified signals from said amplifying means to generate a first and a second detection signals; and a load drivability control means controlled by the first and second detection signals outputted from the detecting means for changing load drivability of the amplifying means, wherein said load drivability control includes:
a first control means that is driven by said second detection signal of said detecting means and increases drivability of said third transistor of said amplifying means; and a second control means that is driven by said first detection signal of said detecting means and increases drivability of said fourth transistor of said amplifying means;

wherein the first control means includes:
a fifth transistor that increases load drivability in cooperation with said third transistor of said amplifying means;

a sixth transistor that disables said fifth transistor in response to said second detection signal; and a seventh transistor that delivers said first amplified signals to gate input of said fifth transistor in response to said second detection signal.

11. The amplifying circuit with variable load drivability as recited in claim 10, wherein said fifth transistor of said first control means and said third transistor of said amplifying means comprise PMOS transistors, and said fifth transistor has a size not less than four (4) times that of said third transistor.

12. The amplifying circuit with variable load drivability as recited in claim 10, wherein said sixth transistor and seventh transistors of said first control means comprise respectively a PMOS transistor and a NMOS transistor, both receiving said second detection signal as gate inputs.

13. An Amplifying circuit with variable load drivability, comprising:

an amplifying means for amplifying input signals a first time through a first and a second transistors to generate first and second amplified signals and the first and second amplified signals a second time through a third and a fourth transistors to generate output signals;

a detecting means for detecting the first and second amplified signals from said amplifying means to generate a first and a second detection signals; and a load drivability control means controlled by the first and second detection signals outputted from the detecting means for changing load drivability of the amplifying means, wherein said load drivability control includes:
a first control means that is driven by said second detection signal of said detecting means and increases drivability of said third transistor of said amplifying means; and a second control means that is driven by said first detection signal of said detecting means and increases drivability of said fourth transistor of said amplifying means;

wherein said second control means includes:
an eighth transistor that increases load drivability in cooperation with said fourth transistor of said amplifying means;

a ninth transistor that disables said eighth transistor in response to said second detection signals; and a tenth transistor that delivers said second amplified signal to a gate input of said eighth transistor in response to said second detection signal.

14. The amplifying circuit with variable load drivability as recited in claim 13, wherein said eighth transistor of said second control means and said fourth transistor of said amplifying means comprise NMOS transistors, and said eighth transistor has a size not less than four times that of said fourth transistor.

15. The amplifying circuit with variable load drivability as recited in claim 13, wherein said ninth and tenth transistors of said second control means respectively comprise a PMOS transistor and an NMOS transistor, both receiving said second detection signal as gate inputs.

* * * * *